(12) United States Patent
Hayashi et al.

(10) Patent No.: US 10,471,715 B2
(45) Date of Patent: Nov. 12, 2019

(54) LIQUID DISCHARGE HEAD

(71) Applicant: BROTHER KOGYO KABUSHIKI KAISHA, Nagoya-shi, Aichi-ken (JP)

(72) Inventors: Hideki Hayashi, Nagoya (JP); Taisuke Mizuno, Yokkaichi (JP); Keita Hirai, Nagoya (JP); Yuichi Ito, Mie-ken (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 0 days.

(21) Appl. No.: 15/921,259

(22) Filed: Mar. 14, 2018

(65) Prior Publication Data

US 2018/0281407 A1 Oct. 4, 2018

(30) Foreign Application Priority Data

Mar. 30, 2017 (JP) ................. 2017-066805

(51) Int. Cl.
*B41J 2/14* (2006.01)
*B41J 2/16* (2006.01)
(Continued)

(52) U.S. Cl.
CPC ....... *B41J 2/14201* (2013.01); *B41J 2/04541* (2013.01); *B41J 2/04548* (2013.01); *B41J 2/04581* (2013.01); *B41J 2/1433* (2013.01); *B41J 2/14233* (2013.01); *B41J 2/1607* (2013.01); *B41J 2/1623* (2013.01); *B41J 2/185* (2013.01); *B41J 2002/14241* (2013.01); *B41J 2002/14419* (2013.01); *B41J 2002/14491* (2013.01); *B41J 2202/03* (2013.01); *B41J 2202/12* (2013.01); *B41J 2202/13* (2013.01);
(Continued)

(58) Field of Classification Search
USPC .......................................................... 347/47
See application file for complete search history.

(56) References Cited

U.S. PATENT DOCUMENTS 7,585,060 B2 * 9/2009 Kanaya ............... B41J 2/14233
347/68
2003/0227519 A1 * 12/2003 Ikeda ................... B41J 2/04541
347/68

(Continued)

FOREIGN PATENT DOCUMENTS

JP 2012-143948 A 8/2012
JP 2013-67178 A 4/2013

*Primary Examiner* — Lam S Nguyen
(74) *Attorney, Agent, or Firm* — Merchant & Gould P.C.

(57) ABSTRACT

There is provided a liquid discharge apparatus which includes a channel substrate having a nozzle, a pressure chamber which communicates with the nozzle, an actuator which covers the pressure chamber, and a contact point that is electrically connected to the actuator, and a circuit board which has wires that are to be electrically connected to contact points, and which is adhered to the channel substrate. The channel substrate includes an adhesive wall which is provided with contact points, and which has a surface to which an adhering portion of the circuit board to be adhered to the channel substrate, is adhered, and further includes a wall portion which is provided with a cavity on a side of the adhesive wall, opposite to the surface, and which demarcates the cavity on a side opposite to the surface, of the adhesive wall, and the adhering portion is facing the cavity and the wall portion.

22 Claims, 12 Drawing Sheets

(51) Int. Cl.
*B41J 2/045* (2006.01)
*B41J 2/185* (2006.01)
*H01L 41/187* (2006.01)
*H01L 41/04* (2006.01)
*H01L 41/047* (2006.01)
*H01L 41/053* (2006.01)
*H01L 41/09* (2006.01)

(52) U.S. Cl.
CPC ........ *H01L 41/042* (2013.01); *H01L 41/0475* (2013.01); *H01L 41/0533* (2013.01); *H01L 41/0973* (2013.01); *H01L 41/1876* (2013.01)

(56) References Cited

U.S. PATENT DOCUMENTS

2011/0205308 A1* 8/2011 Miyata ................. B41J 2/14233
  347/68
2012/0176450 A1 7/2012 Akahane et al.

* cited by examiner

Fig. 4
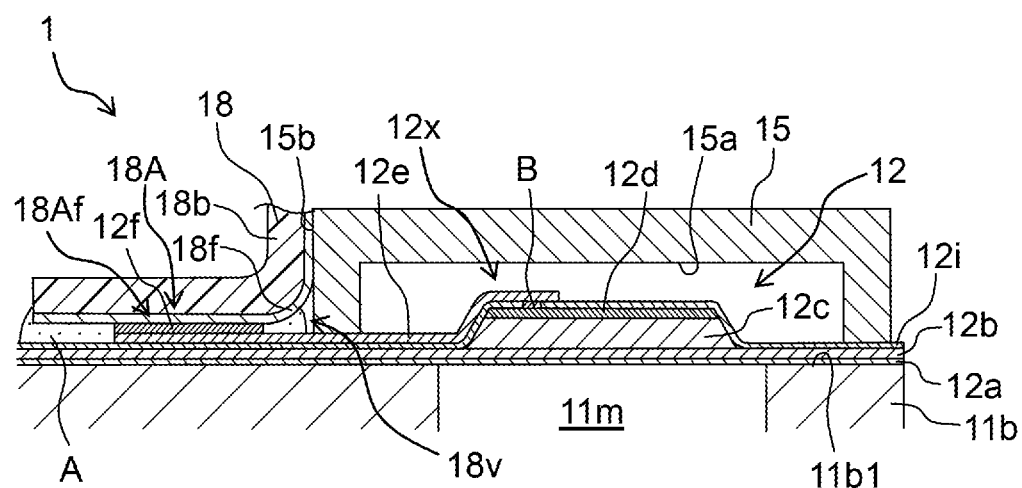

Fig. 5
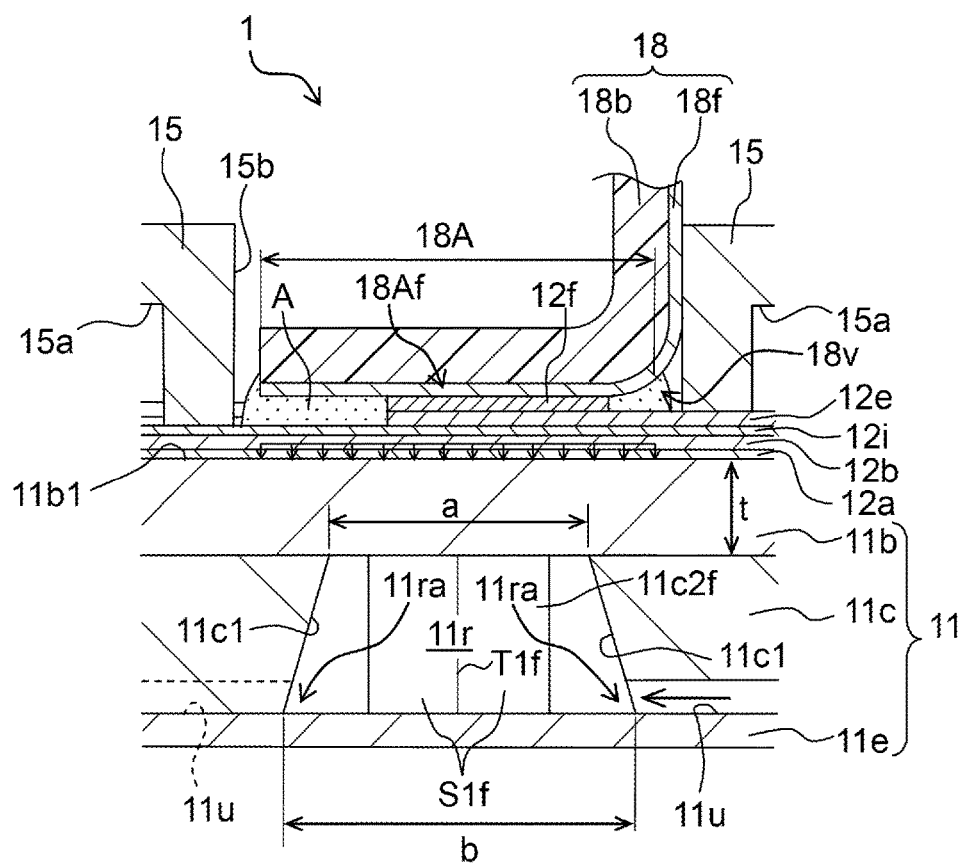
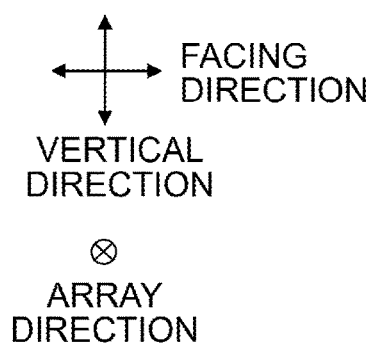

Fig. 7
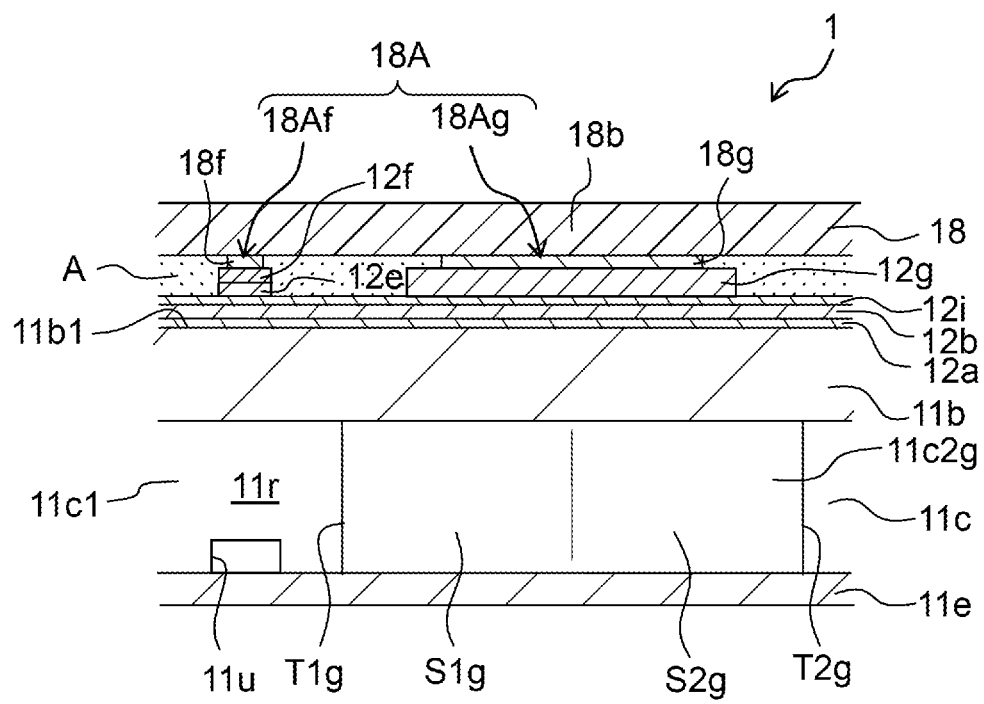
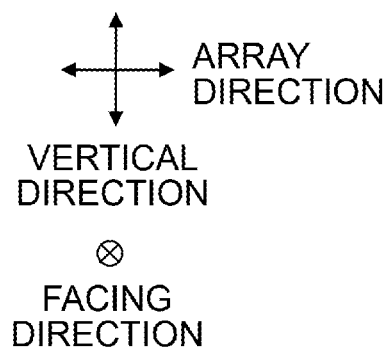

Fig. 10
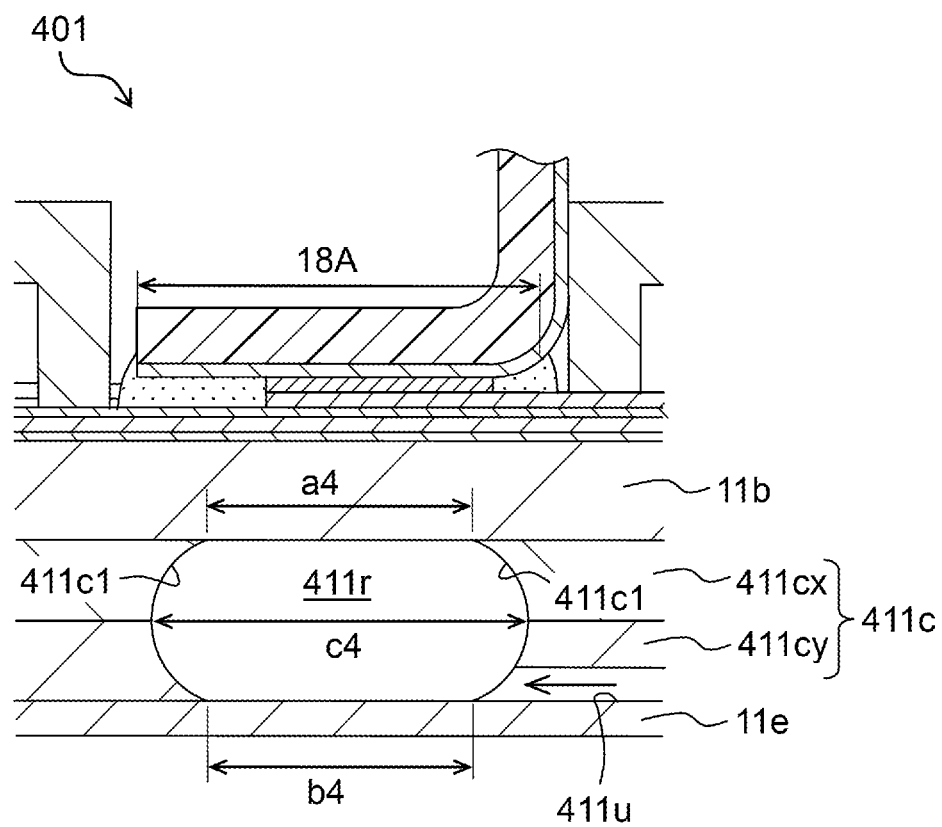
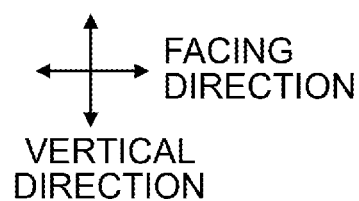

LIQUID DISCHARGE HEAD

CROSS REFERENCE TO RELATED APPLICATION

The present application claims priority from Japanese Patent Application No. 2017-066805, filed on Mar. 30, 2017, the disclosure of which is incorporated herein by reference in its entirety.

BACKGROUND

Field of the Invention

The present teaching relates to a liquid discharge head which includes a channel substrate having contact points, and a circuit board having wires that are to be electrically connected to the contact points.

Description of the Related Art

In liquid discharge heads, the circuit board is adhered at a position facing a cavity formed in the channel substrate. For instance, in a known liquid discharge head, a circulation channel (cavity) is formed in the channel forming substrate (channel substrate), and the circuit board is adhered on a wall at a position facing the circulation channel. The wall is provided with a contact point of the channel forming substrate.

SUMMARY

In the abovementioned liquid discharge head, the whole of a portion, of the circuit board, that is to be adhered to the channel substrate is facing the cavity. The portion, of the circuit board, that is to be adhered to the channel substrate is referred to an adhering portion of the circuit board. Consequently, at the time of adhering the circuit board to the channel substrate, the wall of the channel substrate is deformed due to a load exerted to the adhering portion. In some cases, the wall of the channel substrate may be damaged.

An object of the present teaching is to provide a liquid discharge head which is capable of suppressing a problem of the wall of the channel substrate getting deformed at the time of adhering the circuit board and the channel substrate.

According to an aspect of the present teaching, there is provided a liquid discharge head including: a channel substrate including a nozzle, a pressure chamber communicating with the nozzle, an actuator covering the pressure chamber, and a contact point electrically connected to the actuator; and circuit board including a wire electrically connected to the contact point, the circuit board being adhered to the channel substrate at an adhering portion of the circuit board. The channel substrate includes: an adhering wall having a surface on which the contact point is located, and to which the adhering portion of the circuit board is adhered, and a wall defining a hollow space located on a side opposite to the surface of the adhesive wall, and the adhering portion of the circuit board faces the hollow space and the wall portion.

BRIEF DESCRIPTION OF THE DRAWINGS

FIG. 4 is a diagram showing an area IV in FIG. 3;

FIG. 5 is a diagram showing an area V in FIG. 3;

FIG. 7 is a cross-sectional view along a line VII-VII in FIG. 6;

FIG. 10 is a diagram corresponding to FIG. 5, of a head 401 according to a fourth embodiment;

DETAILED DESCRIPTION OF THE EMBODIMENTS

First Embodiment

Figure 1:
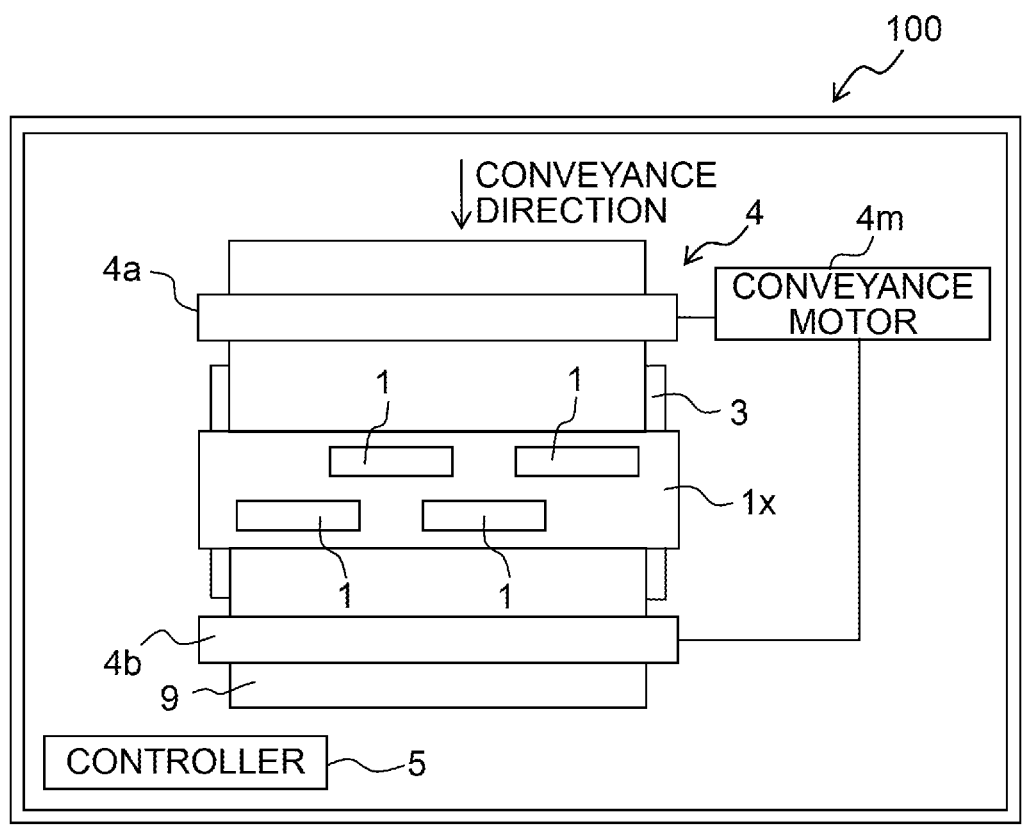
FIG. 1 is a schematic plan view of a printer 100 equipped with a head 1 according to a first embodiment.

An overall configuration of a printer 100 equipped with a head unit 1x including a head 1 according to a first embodiment of the present teaching will be described below with reference to FIG. 1. The head 1 corresponds to the liquid discharge head of the present teaching. The printer 100 includes a platen 3, a conveyance mechanism 4, and a controller 5, and the head unit 1x.

The head unit 1x is of a line type (in other words, a type in which an ink is jetted on to a paper 9 in a state of a position being fixed), and is long in a direction orthogonal to a conveyance direction. The head unit 1x includes four heads 1 arranged in a zigzag form along the direction orthogonal to the conveyance direction. The four heads 1 have the same structure mutually. Each head 1 discharges an ink from a plurality of nozzles 11n (refer to FIG. 2 and FIG. 3).

The platen 3 is arranged above the head unit 1x. An ink is discharged from each head 1 on to the paper 9 supported by the platen 3.

The conveyance mechanism 4 includes two pairs of rollers 4a arranged to be sandwiching the platen 3 in the conveyance direction. By the drive of a conveyance motor 4m, two rollers in each pair of rollers 4a and 4b rotate in mutually opposite directions in a state of the paper 9 being pinched. At this time, the paper 9 is conveyed in the conveyance direction.

The controller 5, on the basis of a recording command that has been input from an external apparatus such as a PC (personal computer), controls the four heads 1 and the conveyance motors 4m such that an image is recorded on the paper 9.

Next, a configuration of the head 1 will be described below with reference to FIG. 2 to FIG. 7. The head 1 includes a channel substrate 11, an actuator unit 12, a tank 14, a protective member 15, and a COF (chip on flexible printed circuit) 18.

Figure 2:
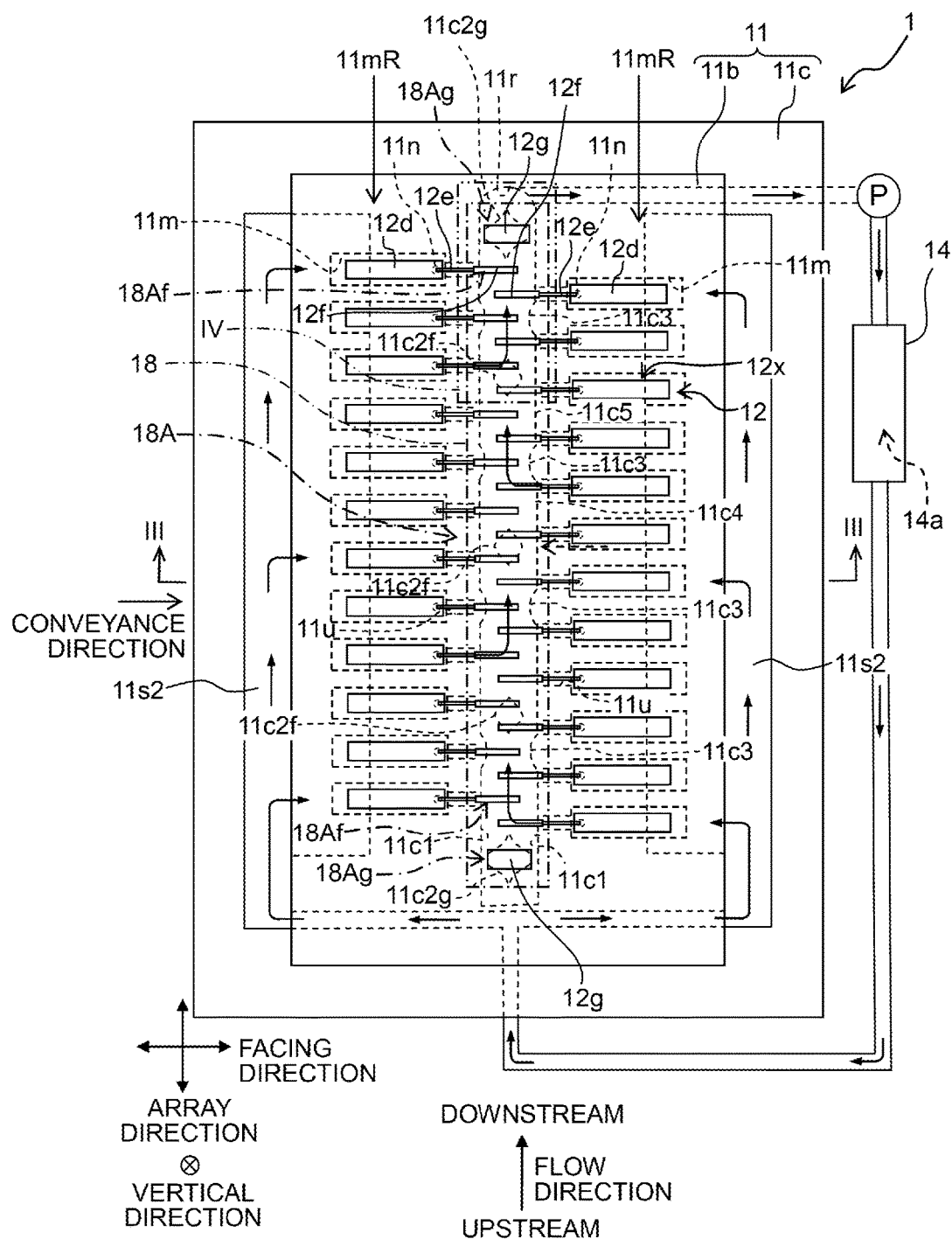
FIG. 2 is a plan view of the head 1 (a reservoir member 11a, a protective member 15, and a protective film 12i are omitted)
Figure 3:
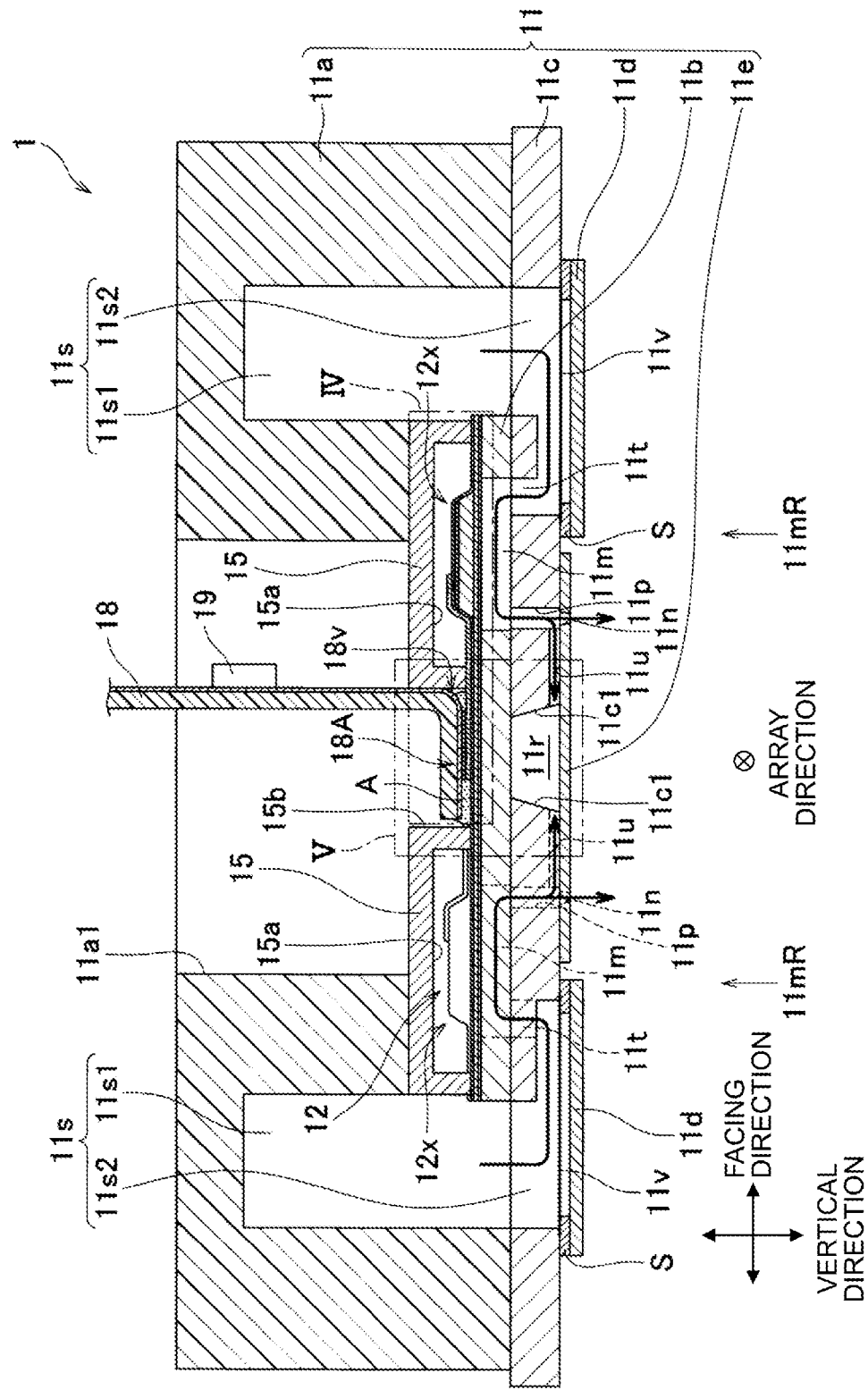
FIG. 3 is a cross-sectional view along a line in FIG. 2.

The channel substrate 11, as depicted in FIG. 3, includes a reservoir member 11a, a pressure-chamber plate 11b, a channel plate 11c, a protective plate 11d, and a nozzle plate 11e, and these plates are adhered mutually. A plurality of pressure chambers 11m, the plurality of nozzles 11n, a supply channel 11s, and a return channel 11r are formed in the channel substrate 11 as depicted in FIG. 2 and FIG. 3.

The pressure-chamber plate 11b is made of a silicon monocrystalline substrate, and has the plurality of pressure chambers 11m formed therein to be cut through as depicted in FIG. 3. The plurality of pressure chambers 11m is arranged in rows to form two pressure-chamber rows 11mR as depicted in FIG. 2. The plurality of pressure chambers 11m forming each pressure-chamber row 11mR is arranged in a row at an equal distance in a direction of array (a direction orthogonal to the conveyance direction). The two pressure-chamber rows 11mR are arranged side-by-side in a direction orthogonal to the array direction (a direction parallel to the conveyance direction, and a facing direction in which a pair of lateral walls 11c1 to be described later are face-to-face). The plurality of pressure chambers 11m is arranged in rows in a zigzag form such that respective positions thereof in the array direction differ.

The channel plate 11c, in a plan view, is slightly larger than the pressure-chamber plate 11b. The channel plate 11c is adhered to a lower surface of the pressure-chamber plate 11b. A manifold 11s2 which is a portion of the supply channel 11s, a channel 11t which connects the manifold 11s2 and each pressure chamber 11m, a descender 11p which connects each pressure chamber 11m and each nozzle 11n, a connecting channel 11u which connects the descender 11p and the return channel 11r, and the return channel 11r are formed in the channel plate 11c as depicted in FIG. 3. The manifold 11s2 and the return channel 11r pass through the channel plate 11c in a direction of thickness thereof, and open at an upper surface and a lower surface of the channel plate 11c. The manifold 11s2, as depicted in FIG. 2, is extended in the array direction, at both outer sides of the two pressure-chamber rows 11mR. The return channel 11r is extended in the array direction, between the two pressure-chamber rows 11mR.

A damper film 11v which is flexible, is adhered to the lower surface of the channel plate 11c to cover the manifold 11s2 as depicted in FIG. 3. The damper film 11v has a function of attenuating (damping) a fluctuation in a pressure of ink inside the manifold 11s2. A spacer S in the form of a frame is fixed to a periphery of the damper film 11v.

The protective plate 11d is adhered to a lower surface of the spacer S to cover the damper film 11v. The damper film 11v is facing the protective plate 11d via a distance in between, and is protected by the protective plate 11d.

The plurality of nozzles 11n communicating with the plurality of pressure chambers 11m respectively is formed in the nozzle plate 11e to be cut through. The nozzle plate 11e is adhered to the lower surface of the channel plate to block the return channel 11r. The plurality of nozzles 11n, as depicted in FIG. 2, is arranged in two rows similarly as the plurality of pressure chambers 11c. The plurality of nozzles 11n is arranged in a zigzag form such that the respective positions thereof in the array direction differ.

A reservoir 11s1 which is a part of the supply channel 11s is formed in the reservoir member 11a as depicted in FIG. 3. The reservoir 11s1, similarly as the manifold 11s2, is extended in the array direction, at both outer sides of the two pressure-chamber rows 11mR. The reservoir 11s1 opens in a lower surface of the reservoir member 11a. The reservoir member 11a is adhered to an upper surface of the channel plate 11c and an upper surface of the protective member 15.

Each of the supply channel 11s and the return channel 11r communicates with a storage chamber 14a of the tank 14 via a tube as depicted in FIG. 2. An ink is stored in the storage chamber 14a. The ink in the storage chamber 14a inflows into the supply channel 11s by a pump P, and is supplied to a plurality of pressure chambers 11m in each pressure-chamber row 11mR from both outer sides of the two pressure-chamber rows 11mR. Some of the ink supplied to each pressure chamber 11m is jetted from the nozzle 11n, and the remaining ink inflows into the return channel 11r which is extended between the two pressure-chamber rows 11mR, and is returned to the storage chamber 14a. Arrow marks in FIG. 2 indicate a flow of the ink that inflows from the pressure chamber 14a into the return channel 11r via the supply channel 11s, and then returns from the return channel 11r to the storage chamber 14a.

The actuator unit 12, as depicted in FIG. 4, is arranged on an upper surface 11b1 of the pressure-chamber plate 11b. The actuator unit 12 includes in order from below, a vibration plate 12a, a common electrode 12b, a plurality of piezoelectric bodies 12c, and a plurality of individual electrodes 12d.

The vibration plate 12a and the common electrode 12b are formed on substantially whole of the upper surface 11b1 of the pressure-chamber plate 11b. The vibration plate 12a and the common electrode 12b cover the plurality of pressure chambers 11m. The plurality of piezoelectric bodies 12c and the plurality of individual electrodes 12d are arranged for each pressure chamber 11m. In other words, the plurality of piezoelectric bodies 12c and the plurality of individual electrodes 12d are arranged to be facing the plurality of pressure chambers 11m respectively.

The vibration plate 12a is a film of silicon dioxide formed by oxidizing a surface of the silicon monocrystalline surface of the pressure-chamber plate 11b. The common electrode 12b is an electrode common to the plurality of pressure chambers 11m, and is arranged at a position facing the plurality of pressure chambers 11m between the vibration plate 12a and the plurality of piezoelectric bodies 12c. The plurality of piezoelectric bodies 12c is made of a piezoelectric material such as lead zirconate titanate (PZT), and is arranged at positions facing the plurality of pressure chambers 11m on an upper surface of the common electrode 12b. The plurality of individual electrodes 12d is formed on upper surfaces of the plurality of the piezoelectric bodies 12c respectively. In other words, each individual electrode 12d is arranged at a position facing each pressure chamber 11m.

A portion of the piezoelectric body 12c, sandwiched between the individual electrode 12d and the common electrode 12b functions as an actuator 12x which is deformable according to a voltage applied to the individual electrode 12d. In other words, the actuator unit 12 includes a plurality of the actuators 12x covering the plurality of pressure chambers 11m respectively. By driving the actuator 12x facing the pressure chamber 11m, a volume of the pressure chamber 11m can be changed. Thereby a pressure is applied to the ink in the pressure chamber 11m, and the ink is jetted from the nozzle 11n. Driving the actuator 12x means deforming the actuator 12x to be projected (to be bulged) toward the pressure chamber 11m according to the voltage applied to the individual electrode 12d.

A protective film 12i is provided on a portion of an upper surface of each individual electrode 12d and an upper surface of the common electrode 12b, where no piezoelectric body 12 has been provided, to cover a lateral surface of each piezoelectric body 12c. The protective film 12i is for protecting the piezoelectric body 12c, and has a function of preventing the moisture in air from entering into the piezoelectric body 12c. The protective film 12i is made of a material such as aluminum oxide (alumina: $Al_2O_3$).

A wire 12e is connected to each individual electrode 12d via a conductive material B filled in a through hole cut through the protective film 12i (refer to FIG. 4). The plurality of wires 12e connected to the plurality of individual electrodes 12d respectively, as depicted in FIG. 2, is extended in a facing direction from each individual electrode 12d corresponding to the two pressure-chamber rows 11mR toward an area between the two pressure-chamber rows 11mR. An individual contact point 12f is formed at a front end of each wire 12e. A plurality of the individual contact points 12f is arranged in a zigzag form along the direction of arrow, in the area between the two pressure-chamber rows 11mR.

A pair of common contact points 12g is provided to sandwich the plurality of individual contact points 12f. The pair of common contact points 12g is electrically connected to the common electrode 12b via a conductive material (omitted in the diagram) filled in the through hole cut through the protective film 12i.

The pair of common contact points 12g and the plurality of individual contact points 12f correspond to the contact point of the present teaching. The pair of common contact points 12g is electrically connected to the common electrode 12b of the plurality of actuators 12x. The plurality of individual contact points 12f is electrically connected to the individual electrodes 12d of the plurality of actuators 12x respectively.

The protective member 15, as depicted in FIG. 3, has a pair of recesses 15a, each extended in the array direction. Each recess 15a opens in a lower surface of the protective member 15. The protective member 15 is adhered to the upper surface 11b1 of the pressure-chamber plate 11b via the vibration plate 12a, the common electrode 12b, and the protective film 12i, such that the plurality of piezoelectric bodies 12c corresponding to each pressure-chamber row 11mR is accommodated in each recess 15a.

The protective member 15 has a through hole 15b at a center in the direction orthogonal to the array direction. The reservoir member 11a has a through hole 11a1 at a center in the direction orthogonal to the array direction. The contact points 12f and 12g (the individual contact point 12f and the common contact point 12g) are exposed through the through holes 15b and 11a1.

The COF 18 corresponds to the circuit board of the present teaching, and as depicted in FIG. 4, FIG. 5, and FIG. 7, includes a sheet 18b which has an insulating property and which is made of polyimide, a plurality of individual wires 18f to be electrically connected to the plurality of individual contact points 12f respectively, and a pair of common wires 18g to be electrically connected to the pair of common contact points 12g respectively. The individual wires 18f and the common wires 18g are provided on the surface of the sheet 18b.

One end of the COF 18 is adhered to the upper surface 11b1 of the pressure-chamber plate 11b via an adhesive A, in a state of the individual wire 18f and the common wire 18g facing the individual contact point 12f and the common contact point 12g respectively as depicted in FIG. 7. An ACF (anisotropic conductive film) can be used as the adhesive A. The COF 18 includes a curved portion 18v which is bent near one end, and is extended upward from the curved portion 18v, upon passing the through holes 15b and 11a1, and the other end (thereof) is electrically connected to the controller 5 (refer to FIG. 1).

The one end of the COF 18 has an adhering portion (adhering portion) 18A which is to be adhered to the channel substrate 11. Specifically, the adhering portion 18A is a portion (at least a portion facing the contact points 12f and 12g of the channel substrate 11) of the COF 18, facing a surface (the upper surface 11b1 of the pressure-chamber plate 11b) provided with the contact points 12f and 12g of the channel substrate 11. The adhering portion 18A of the present embodiment is a range from a front tip of the one end of the COF 18 up to the curved portion 18v (refer to FIG. 5) in the present embodiment. The adhering portion 18A includes an adhering portion 18Ag of each common contact point 12g and each common wire 18g, and an adhering portion 18Af of each individual contact point 12f and each individual wire 18f. An area of the adhering portion 18Ag is larger than an area of the adhering portion 18Af.

A driver IC 19 is mounted between the one end and the other end of the COF 18 as depicted in FIG. 3. The driver IC 19 is electrically connected to each of the contact points 12f and 12g, and the controller 5 via the wires 18f and 18g. The driver IC 19 generates a drive signal for driving the actuator 12x on the basis of a signal from the controller 5, and supplies the drive signal to each individual electrode 12d. An electric potential of the common electrode 12b is maintained to be a ground electric potential.

Next, an arrangement of the return channel 11r formed in the channel substrate 11 will be described specifically with reference to FIG. 5 to FIG. 7.

The pressure-chamber plate 11b corresponds to the adhesive wall of the present teaching, and the return channel 11r corresponds to the cavity of the present teaching.

The contact points 12f and 12g are provided to the upper surface 11b1 of the pressure-chamber plate 11b as depicted in FIG. 5 and FIG. 7, and the adhesive layer 18A of the COF 18 are adhered to the upper surface 11b1. The return channel 11r is provided to an opposite side (lower side) of the upper surface 11b1 of the pressure-chamber plate 11b.

A length of the return channel 11r along the facing direction is the shortest in a portion of contact with the pressure-chamber plate 11b as depicted in FIG. 5. Specifically, a cross-section of the return channel 11r in a vertical direction (direction in which the adhering portion 18A and the return channel 11r are face-to-face) and the facing direction has a trapezoidal shape. A length a of an upper base of the trapezoidal shape is shorter than a length b of a lower base of the trapezoidal shape (a<b). Here, the length a of the upper base of the trapezoidal shape is a length along the facing direction of a portion of the return channel 11r, in contact with the pressure-chamber plate 11b. The length b of the lower base of the trapezoidal shape is a length along the facing direction of a portion of the return channel 11r, farthest from the pressure-chamber plate 11b in the vertical direction.

Let a thickness of the pressure-chamber plate 11b be t. Let a length between the pair of side portions of the return channel 11r of a portion the pressure-chamber plate 11b, in contact with the return channel 11r be a. In other words, let a length along the facing direction of the portion of the return channel 11r, in contact with the pressure-chamber plate 11b be a. Let a pressure which is exerted to the pressure-chamber plate be x. In the present embodiment, the following expression is satisfied.

$$t/a \geq -1.5846x + 22.75$$

The abovementioned expression has been derived by simulation with the pressure x=100N, 150N, and 200N, assuming a material of the pressure-chamber plate 11b.

The channel plate 11c includes a pair of lateral walls 11c1 demarcating the pair of side portions of the return channel 11r respectively, on a side (lower side) of the pressure-chamber plate 11*b*, opposite to the upper surface 11*b*1. The pair of lateral walls 11*c*1 corresponds to the wall portion of the present teaching, and the adhering portion 18A is facing each of the return channel 11*r* and the pair of lateral walls 11*c*1.

The channel plate 11*c* further includes a plurality of narrow portions 11*c*3 formed by the pair of lateral walls 11*c*1 as depicted in FIG. 2. The narrow portion 11*c*3 is a portion for which a distance between the pair of lateral walls 11*c*1 is smaller than a portion 11*c*4 adjacent to an upstream side of a direction of flow and a portion 11*c*5 adjacent to a downstream side of the direction of flow. The direction of flow is a direction in which the ink inside the return channel 11*r* flows, and is a direction parallel to a direction in which the return channel 11*r* is extended (in other words, the array direction). The pair of lateral walls 11*c*1 is protruded inward at an equal interval in the direction of flow. Accordingly, the plurality of narrow portions 11*c*3 is provided at an equal interval in the direction of flow. The adhering portion 18A is facing the narrow portion 11*c*3, to be symmetrical on the upstream side and the downstream side of the direction of flow, with respect to a center O of the adhering portion 18A in the direction of flow.

A plurality of columns 11*c*2*f* and 11*c*2*g* is provided inside the return channel 11*r*. The columns 11*c*2*f* and 11*c*2*g*, as depicted in FIG. 5 and FIG. 7, connect the pressure-chamber plate 11*b* and the nozzle plate 11*e*, and are provided at positions facing the individual contact point 12*f* and the common contact point 12*g* respectively. The nozzle plate 11*e* is facing the pressure-chamber plate 11*b* sandwiching the return channel 11*r* in between, thereby blocking the return channel 11*r*, and corresponds to the blocking wall of the present teaching.

The columns 11*c*2*f* and 11*c*2*g*, as depicted in FIG. 2, are separated apart mutually in the direction of flow, and are provided at an equal interval in the direction of flow. The adhering portion 18A is facing the columns 11*c*2*f* and 11*c*2*g*, to be symmetrical on the upstream side and the downstream side of the direction of flow, with respect to the center O of the adhering portion 18A in the direction of flow. Each column 11*c*2*g* has a cross-sectional area orthogonal to a vertical direction, larger than (a cross-sectional area orthogonal to the vertical direction of) each column 11*c*2*f*, and a dimension of an area of the adhering portion 18A*g* facing the column 11*c*2*g* is larger than a dimension of an area of the adhering portion 18A*f* facing the column 11*c*2*f*.

In addition to the pair of lateral walls 11*c*1, the plurality of columns 11*c*2*f* and 11*c*2*g* also corresponds to the wall portion of the present teaching, and the adhering portion 18A is facing the pair of lateral walls 11*c*1 and the columns 11*c*2*f* and 11*c*2*g*, to be symmetrical on the upstream and the downstream side of the direction of flow, with respect to a center O of the adhering portion 18A in the direction of flow.

Figure 6:
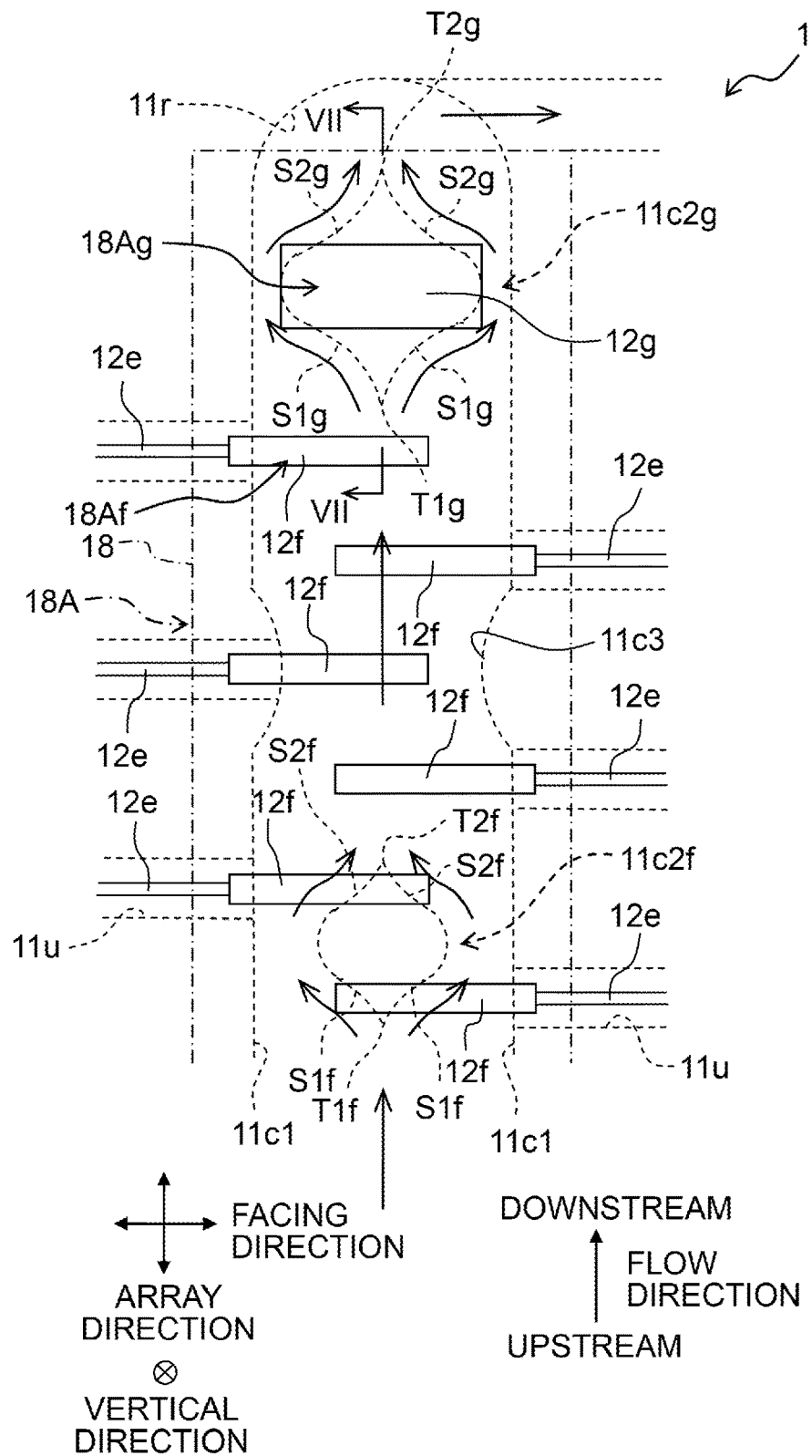
FIG. 6 is a diagram showing an area VI in FIG. 2.

Each of the columns 11*c*2*f* and 11*c*2*g*, as depicted in FIG. 6, has a tapered shape tapering toward the upstream side of the direction of flow. Specifically, each of the columns 11*c*2*f* and 11*c*2*g* is extended toward the downstream side of the direction of flow from upstream apex portions T1*f* and T1*g*, and upstream apex portions T1*f* and T1*g*, and has a pair of upstream lateral surfaces S1*f* and S1*g* having a streamlined shape gradually approaching the pair of lateral walls 11*c*1 respectively toward the downstream side.

Each of the columns 11*c*2*f* and 11*c*2*g*, furthermore, has a tapered shape tapering toward the downstream side of the direction of flow. Specifically, each of the columns 11*c*2*f* and 11*c*2*g* is extended toward the upstream side of the direction of flow from downstream apex portions T2*f* and T2*g*, and downstream apex portions T2*f* and T2*g*, and further has a pair of downstream lateral surfaces S2*f* and S2*g* having a streamlined shape gradually approaching the pair of lateral walls 11*c*1 respectively toward the downstream side. The pair of downstream lateral surfaces S2*f* and S2*g* is connected to the pair of upstream lateral surfaces S1*f* and S1*g* respectively.

The ink inside the return channel 11*r* flows as depicted by thick arrow marks in FIG. 6, along the lateral surfaces S1*f*, S1*g*, S2*f*, and S2*g* of the columns 11*c*2*f* and 11*c*2*g*.

As mentioned above, according to the present embodiment, the adhering portion 18A of the COF 18 is facing not only the return channel 11*r*, but also the lateral wall 11*c*1, and the columns 11*c*2*f* and 11*c*2*g* (refer to FIG. 2 and FIG. 5). Therefore, at the time of adhering the COF 18 to the channel substrate 11, a load exerted to the adhering portion 18A is supported by the lateral wall 11*c*1, and the columns 11*c*2*f* and 11*c*2*g*, and a problem of the pressure-chamber plate 11*b* getting deformed due to the load is suppressed.

The adhering portion 18A is facing each lateral wall 11*c*1 in the pair of lateral walls 11*c*1. In this case, the load exerted to the adhering portion 18A being supported by the pair of lateral walls 11*c*1 from both sides, the problem of the pressure-chamber plate 11*b* getting deformed is suppressed more assuredly.

A length of the return channel 11*r* along the facing direction is the shortest at a portion in contact with the pressure-chamber plate 11*b* (refer to FIG. 5). In this case, a portion of the pair of lateral walls 11*c*1, in contact with the pressure-chamber plate 11*b* supports the load exerted to the adhering portion 18A. It is possible to secure a space inside the return channel 11*r* at a portion of the pair of lateral walls 11*c*1, away from the pressure-chamber plate 11*b*.

The cross-section of the return channel 11*r* in the vertical direction (direction in which the adhering portion 18A and the return channel 11*r* are face-to-face) and the facing direction has a trapezoidal shape. In this case, it is possible to form the return channel 11*r* easily.

The channel substrate 11 includes the columns 11*c*2*f* and 11*c*2*g*, and the adhering portion 18A is facing the columns 11*c*2*f* and 11*c*2*g* (refer to FIG. 2 and FIG. 6). In this case, the load exerted to the adhering portion 18A is supported by the columns 11*c*2*f* and 11*c*2*g*, and the problem of the pressure-chamber plate 11*b* getting deformed is suppressed more assuredly.

The adhering portion 18A is facing the plurality of columns 11*c*2*f* and 11*c*2*g* provided to be separated apart mutually in the array direction (direction in which the return channel is extended) (refer to FIG. 2 and FIG. 6). In this case, the load exerted to the adhering portion 18A is supported by the plurality of columns 11*c*2*f* and 11*c*2*g*. Therefore, the problem of the pressure-chamber plate 11*b* getting deformed is suppressed more assuredly. Moreover, as compared to a case of providing one large column inside the return channel 11*r*, it is possible to secure a space inside the return channel 11*r*.

In the present embodiment, the cavity (return channel 11*r*) forms a channel through which a liquid (ink) flows. In this case, by making an efficient use of a space facing the channel as an adhesive area of the COF 18, a small-sizing of the head 1 is realized.

In the present embodiment, the return channel 11*r* is the cavity. The return channel 11*r* is formed to be comparatively long (refer to FIG. 2) in order to communicate with each of the plurality of pressure chambers 11*m*. According to the abovementioned arrangement, it is possible to use effectively a space facing the long channel as an adhesive area of the COF 18.

The return channel 11*r* is arranged between the two pressure-chamber rows 11*m*R that are mutually adjacent, and is shared by the two pressure-chamber rows 11*m*R (refer to FIG. 2 and FIG. 3). In this case, it is possible to realize simplification and small-sizing of the arrangement of the head 1, as compared to a case of providing an individual return channel 11*r* for the two pressure-chamber rows 11*m*R.

The adhering portion 18A is facing the lateral wall 11*c*1, and the columns 11*c*2*f* and 11*c*2*g*, to be symmetrical on the upstream side and the downstream side of the direction of flow, with respect to the center O of the adhering portion 18A in the direction of flow (refer to FIG. 2). In this case, a load is exerted symmetrically on the upstream side and the downstream side of the direction of flow, and it is possible to adhere the COF 18 uniformly in the direction of flow.

The adhering portion 18A is facing the columns 11*c*2*f* and 11*c*2*g*, to be symmetrical on the upstream side and the downstream side of the direction of flow, with respect to the center O of the adhering portion 18A in the direction of flow (refer to FIG. 2). In this case, the load exerted to the adhering portion 18A is supported by the columns 11*c*2*f* and 11*c*2*g*, symmetrically on the upstream side and the downstream side of the direction of flow, and it is possible to adhere the COF 18 uniformly in the direction of flow.

Each of the columns 11*c*2*f* and 11*c*2*g* has a tapered shape tapering toward the upstream side (refer to FIG. 6). In this case, it is possible to suppress a problem of the flow of ink being hindered by the columns 11*c*2*f* and 11*c*2*g*.

Each of the columns 11*c*2*f* and 11*c*2*g* has a tapered shape tapering further toward the downstream side (refer to FIG. 6). In this case, it is possible to suppress a problem of air bubbles in the ink being accumulated.

The adhering portion 18A is facing the narrow portion 11*c*3, to be symmetrical on the upstream side and the downstream side of the direction of flow, with respect to the center O of the adhering portion 18A in the direction of flow (refer to FIG. 2). In this case, a flow velocity (flow rate) of the ink in the narrow portion 11*c*3 increases. Accordingly, the discharge of air bubbles in the ink is facilitated.

The area of the adhering portion 18Ag adhering each common contact point 12*g* and each common wire 18*g* is larger than the area of the adhering portion 18Af adhering each individual contact point 12*f* and each individual wire 18*f*. Moreover, an area of the adhering portion 18Ag facing the column 11*c*2*g* is larger than an area of the adhering portion 18Af facing the column 11*c*2*f*. In this case, by making a dimension of the area facing the column 11*c*2*g*, in the adhering portion 18Ag which has a comparatively larger area and which is subjected to (comparatively) heavier load, a problem of the pressure-chamber plate 11*b* getting deformed is suppressed assuredly.

Let the thickness of the pressure-chamber plate 11*b* be t. Let the length between the pair of side portions of the return channel 11*r* of the portion of pressure-chamber plate 11*b*, in contact with the return channel 11*r* be a. In other words, let the length along the facing direction of the portion of the return channel 11*r*, in contact with the pressure-chamber plate 11*b* be a. Let the pressure which is exerted to the pressure-chamber plate 11*b* be x.

In the present embodiment, the following expression is satisfied.

$$t/a \geq -1.5846x + 22.75$$

In this case, the problem of the pressure-chamber plate 11*b* getting deformed by the pressure x is suppressed assuredly.

Second Embodiment

Next, a head 201 according to a second embodiment of the present teaching will be described below with reference to FIG. 8.

Figure 8:
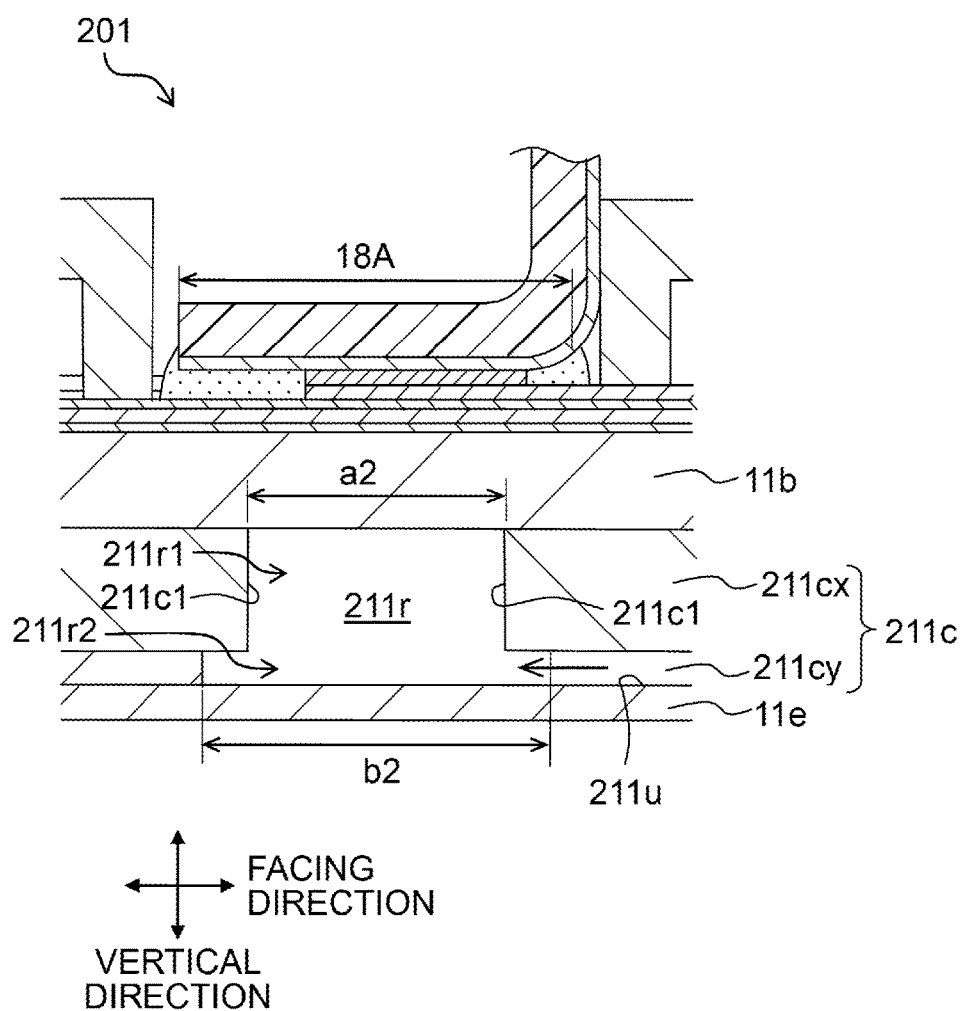
FIG. 8 is a diagram corresponding to FIG. 5, of a head 201 according to a second embodiment.

While in the first embodiment, the cross-sectional shape of the return channel 11*r* is a trapezoidal shape as depicted in FIG. 5, in the present embodiment, a cross-sectional shape of a return channel 211*r* is a projected shape (projection shape) as depicted in FIG. 8. Specifically, the return channel 211*r* includes a small rectangular portion 211*r*1 and a large rectangular portion 211*r*2 which is larger than the small rectangular portion 211*r*1, both having a cross-section along a vertical direction (a direction in which the adhering portion 18A and the return channel 211*r* are face-to-face), and the facing direction.

According to the present embodiment, by letting the cross-section of the return channel 211*r* to be the projected shape (projection shape), it is possible to form the return channel 211*r* easily by using two members (refer to two plates 211*cx* and 211*cy* of a channel plate 211*c*). Specifically, the channel plate 211*c* includes the plate 211*cx* which demarcates the small rectangular portion 211*r*1 and the plate 211*cy* which demarcates the large rectangular portion 211*r*2. The plate 211*cx* is adhered to the lower surface of the pressure-chamber plate 11*b*, the plate 211*cy* is adhered to a lower surface of the plate 211*cx*, and the nozzle plate 11*e* is adhered to a lower surface of the plate 211*cy*. Apart from the large rectangular portion 211*r*2, a connecting channel 211*u* which connects the descender 11*p* (refer to FIG. 3) and the return channel 211*r*, is formed in the plate 211*cy*. The manifold 11*s*2, the channel 11*t*, and the descender 11*p* are formed in the two plates 211*cx* and 211*cy*.

A length of the return channel 211*r* along the facing direction, similar to that of the return channel 11*r* in the first embodiment, is the shortest in a portion of contact with the pressure-chamber plate 11*b*. Specifically, a length a2 along the facing direction of the small rectangular portion 211*r*1 is shorter than a length b2 along the facing direction of the larger rectangular portion 211*r*2 (a2<b2). Accordingly, similarly as in the first embodiment, it is possible to support the load exerted to the adhering portion 18A at a portion of a pair of lateral walls 211*c*1, in contact with the pressure-chamber plate 11*b*, and to secure a space inside the return channel 11*r* at a portion of the pair of lateral walls 211*c*1, away from the pressure-chamber plate 11*b*.

Third Embodiment

Next, a head 301 according to a third embodiment of the present teaching will be described below with reference to FIG. 9.

In the first embodiment, the cross-sectional shape of the return channel 11*r* is a trapezoidal shape as depicted in FIG. 5. In the present embodiment, a cross-sectional shape of a return channel 311*r* is a hexagonal shape as depicted in FIG. 9. Specifically, the return channel 311*r* has a hexagonal-shaped cross section along a vertical direction (a direction in which the adhering portion 18A and the return channel 311*r* are face-to-face) and the facing direction.

According to the present embodiment, the cross-section of the return channel 311*r* is let to be hexagonal-shaped. Consequently, it is possible to form the return channel 311*r* easily by using two members (refer to two plates 311cx and 311cy of a channel plate 311c). Specifically, the channel plate 311c includes the plate 311cx which demarcates an upper-half space (trapezoidal in cross-sectional view) of the return channel 311r and the plate 311cy which demarcates a lower-half space (reverse trapezoidal in cross-sectional view) of the return channel 311r. The plate 311cx is adhered to the lower surface of the pressure-chamber plate 11b, the plate 311cy is adhered to a lower surface of the plate 311cx, and the nozzle plate 11e is adhered to a lower surface of the plate 311cy. Apart from the upper-half space of the return channel 311r, a connecting channel 311u which connects the descender 11p (refer to FIG. 3) and the return channel 311r is formed in the plate 311cy. The manifold 11s2, the channel 11t, and the descender 11p are formed in the two plates 311cx and 311cy.

A length of the return channel 311r along the facing direction, similar to that of the return channel 11r in the first embodiment, is the shortest in a portion of contact with the pressure-chamber plate 11b. Accordingly, similarly as in the first embodiment, a portion of a pair of lateral walls 311c1 in contact with the pressure-chamber plate 11b, supports the load exerted to the adhering portion 18A. It is possible to secure a space inside the return channel 311r at a portion of the pair of lateral walls 311c1, away from the pressure-chamber plate 11b.

Let a length along the facing direction of a portion of the return channel 311r, in contact with pressure-chamber plate 11b be a3. Let a length along the facing direction of a portion of the return channel 311r, farthest in the vertical direction from the pressure-chamber 11b be b3. Let a length along the facing direction of a portion of the return channel 311r other than the portion in contact with the pressure-chamber 11b and the portion farthest in the vertical direction from the pressure-chamber plate 11b be c3. In this case, the length a3 and the length b3 are shorter than the length c3 (c3>a3=b3). In a case in which, an ink containing a sedimentation component (such as pigment) flows through the return channel 311r, when a length along the facing direction of the portion of the return channel 311r, farthest from the pressure-chamber plate 11b is longer than the length along the facing direction of the other portion, a corner portion is formed at an end in the facing direction of the portion of the return channel 311r, farthest from the pressure-chamber plate 11b (refer to a corner portion 11ra in FIG. 5), and a problem of accumulation of the sedimentation component in the corner portion arises. Regarding this point, according to the present embodiment, it is possible to suppress the abovementioned problem by the corner portion not being formed.

Fourth Embodiment

Next, a head 401 according to a fourth embodiment of the present teaching will be described below with reference to FIG. 10.

Figure 9:
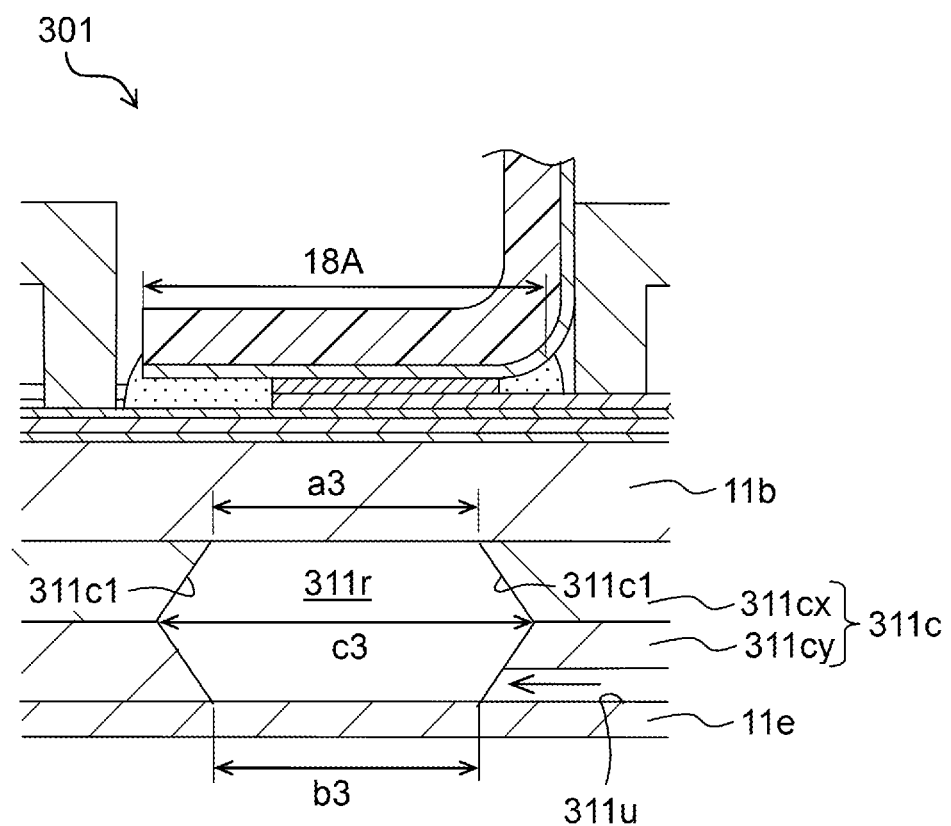
FIG. 9 is a diagram corresponding to FIG. 5, of a head 301 according to a third embodiment.

In the third embodiment, the cross-sectional shape of the return channel 311r is the hexagonal shape as depicted in FIG. 9. In the present embodiment, a cross-sectional shape of a return channel 411r is an elliptical shape as depicted in FIG. 10. Specifically, the return channel 411r has an elliptical-shaped cross section along a vertical direction (a direction in which the adhering portion 18A and the return channel 411r are face-to-face) and the facing direction.

A channel 411c includes a plate 411cx which demarcates an upper-half space of the return channel 411r, and a plate 411cy which demarcates a lower-half space of the return channel 411r, similarly as in the third embodiment. The plate 411cx is adhered to the lower surface of the pressure-chamber plate 11b, the plate 411cy is adhered to a lower surface of the plate 411cx, and the nozzle plate 11e is adhered to a lower surface of the plate 411cy. Apart from the lower-half space of the return channel 411r, a connecting channel 411u which connects the descender 11p (refer to FIG. 3) and the return channel 411r is formed in the plate 411cy. The manifold 11s2, the channel 11t, and the descender 11p are formed in the two plates 411cx and 411cy.

Similar to the return channel 311r in the third embodiment, a length of the return channel 411r along the facing direction is the shortest in a portion of contact with the pressure-chamber plate 11b. Accordingly, similarly as in the first embodiment and the third embodiment, a portion of the return channel 411r in contact with the pressure-chamber plate 11b of a pair of lateral walls 411c1 supports a load exerted to the adhering portion 18A. It is possible to secure a space inside a portion of the return channel 411r away from the pressure-chamber plate 11b of the pair of lateral walls 411c1.

Let a length along the facing direction of a portion of the return channel 411r, in contact with the pressure-chamber plate 11b be a4. Let a length along the facing direction of a portion of the return channel 411r, farthest in the vertical direction from the pressure-chamber plate 11b be b4. Let a length along the facing direction of a portion of the return channel 411r other than the portion in contact with the pressure-chamber plate 11b and the portion farthest in the vertical direction from the pressure-chamber plate 11b be c4. For example, let a length in the facing direction at a center in the vertical direction of the return channel 411r be c4. For the return channel 411r, a relationship c4>a4=b4 is established similarly as for the return channel 311r in the third embodiment. Consequently, according to the present embodiment, in a case in which, an ink containing a sedimentation component (such as pigment) flows through the return channel 411r, a corner portion (refer to the corner portion 11ra in FIG. 5) is not formed, and it is possible to suppress the problem of accumulation of the sedimentation component in the corner.

Fifth Embodiment

Figure 11:
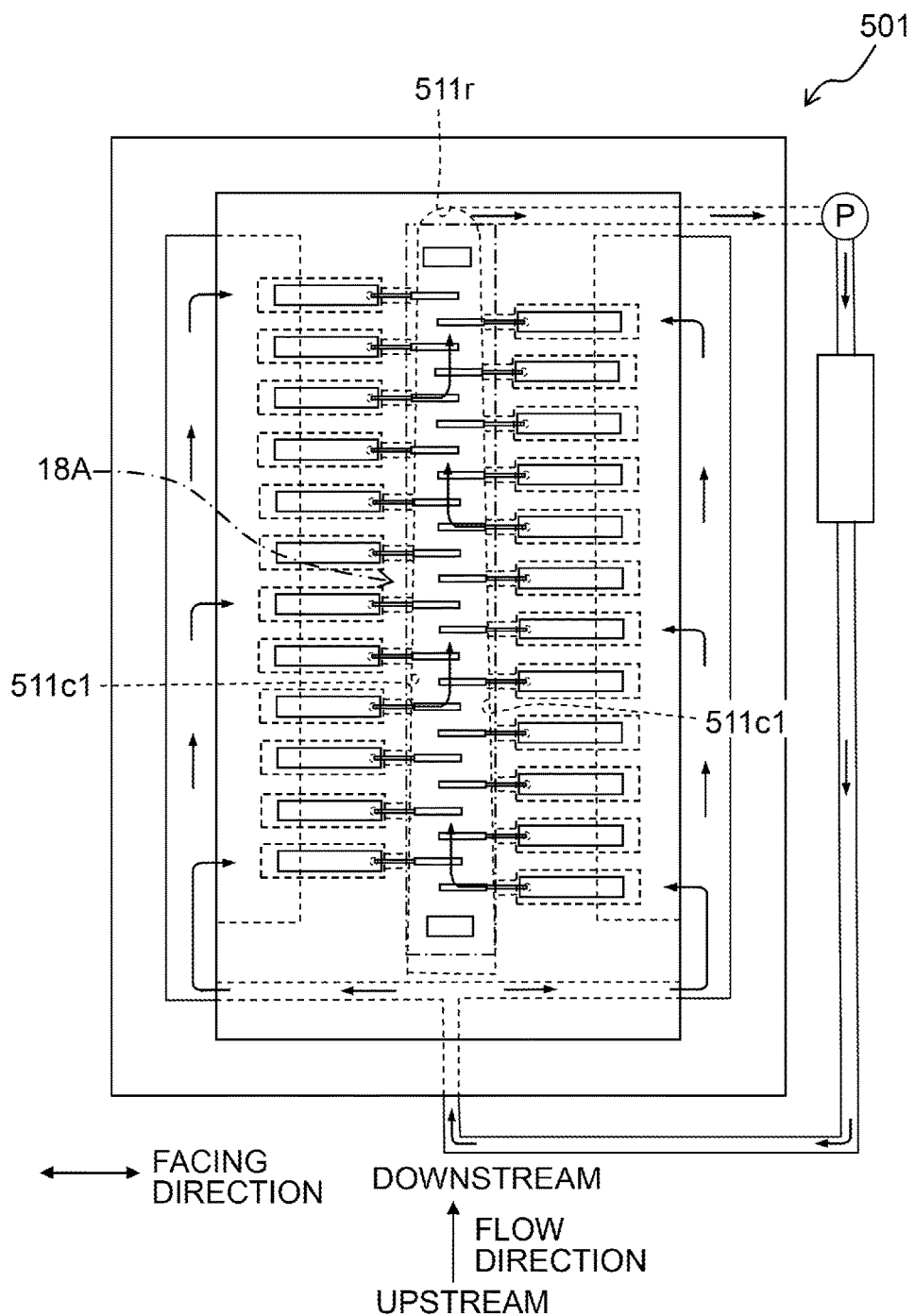
FIG. 11 is a plan view corresponding to FIG. 2, of a head 501 according to a fifth embodiment.

Next, a head 501 according to a fifth embodiment of the present teaching will be described below with reference to FIG. 11.

In the first embodiment, the return channel 11r has a substantially uniform width except for the narrow portion 11c3 as depicted in FIG. 2. However, in the present embodiment, a width (a length in the facing direction) of a return channel 511r becomes smaller from the upstream side toward the downstream side of the direction of flow as depicted in FIG. 11. According to the present embodiment, the width of the return channel 511r narrows gradually from the upstream side toward the downstream side in the direction of flow. Accordingly, it is possible to form easily an area facing a pair of lateral walls 511c1, in the adhering portion 18A. Moreover, by the flow velocity of ink increasing from the upstream side toward the downstream side in the direction of flow, the discharge of air bubbles in the ink is facilitated.

In the present embodiment, the narrow portion 11c3, and the columns 11c2f and 11c2g are omitted.

Sixth Embodiment

Figure 12:
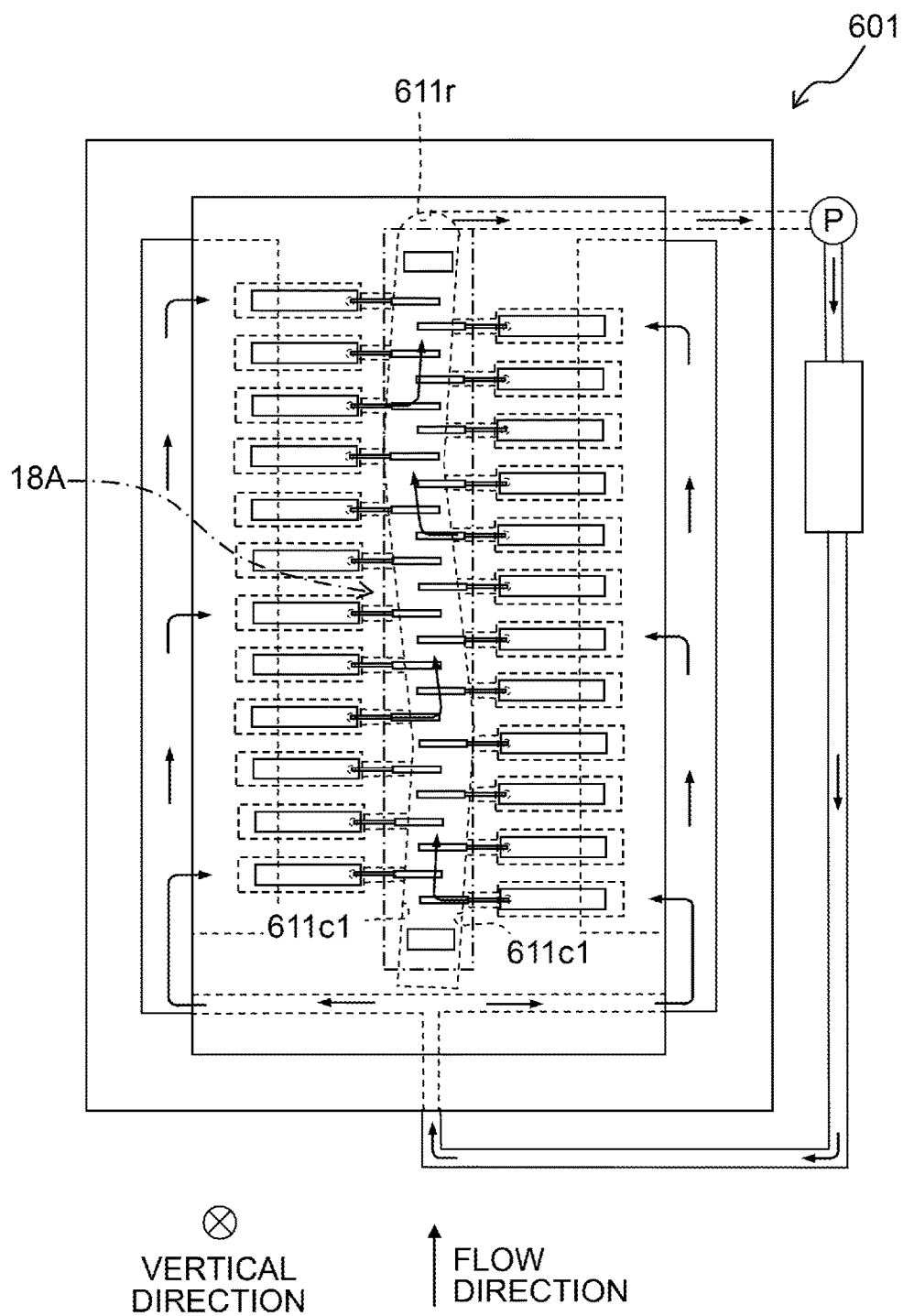
FIG. 12 is a plan view corresponding to FIG. 2, of a head 601 according to a sixth embodiment.

Next, a head 601 according to a sixth embodiment of the present teaching will be described below with reference to FIG. 12.

In the first embodiment, the return channel 11r is linear (straight) along the direction of flow (direction in which the return channel 11r is extended) when viewed from the vertical direction as depicted in FIG. 2. In the present embodiment, a return channel 611r has a zigzag shape along the direction of flow (direction in which the return channel 611r is extended) when viewed from the vertical direction as depicted in FIG. 12. According to the present embodiment, by the return channel 611r having the zigzag shape, it is possible to form easily an area facing a pair of wall portions 611c1, in the adhering portion 18A. Moreover, in a case in which the ink containing a sedimentation component (such as pigment) flows inside the return channel 611r, it is possible to suppress the problem of accumulation of the sedimentation component inside the return channel 611r.

In the present embodiment, the narrow portion 11c3, and the columns 11c2f and 11c2g are omitted.

The preferred embodiments of the present teaching have been described above. However, the present teaching is not restricted to the abovementioned embodiments, and various design modifications are possible without departing from the scope of the patent claims (present teaching).

Modified Embodiment

The adhering portion may be facing one of the pair of wall portions, and may not be facing the other of the pair of wall portions. The adhering portion may be facing the wall portion asymmetrically on the upstream side and the downstream side of the direction of flow, with respect to the center of the adhering portion in the direction of flow. The adhering portion may not be limited to be facing the plurality of columns, and may be facing one column.

The column is not restricted to have the tapered shape, and may be circular cylindrical shaped. One column may be provided inside the cavity, or the column may not be provided inside the cavity.

The length along the facing direction of the portion of the return channel (cavity) of the third embodiment and the fourth embodiment, in contact with the adhesive wall, and the length in the facing direction of the portion of the return channel (cavity) of the third embodiment and the fourth embodiment farthest from the adhesive wall are mutually same. However, these lengths may differ provided that these lengths are shorter than the length along the facing direction of the portion other than the portion in contact with the adhesive wall and the portion farthest from the adhesive wall. The length along the facing direction of the cavity is not restricted to be the shortest in the portion in contact with the adhesive wall, and the length along the facing direction may be uniform. The cross-sectional shape of the cavity is not restricted to be the trapezoidal shape, the projected shape (projection shape), the hexagonal shape, and the elliptical shape, and may be a shape such as a rectangular shape and a circular shape. The cavity is not restricted to the return channel, and may be a supply channel (a channel that supplies a liquid to the plurality of pressure chambers). The cavity may not include a channel through which a liquid flows (in other words, a liquid may not flow through the cavity). The blocking wall which blocks the cavity may not be there (in other words, the cavity may be in the form of a recess opening in a direction away from the adhesive wall).

The number of pressure-chamber rows may not be restricted to two, and may be one, or three or more than three. Moreover, the pressure chambers may not be arranged to form a pressure-chamber row.

The return channel may be arranged between the two pressure chambers. The return channel may not be formed in the channel substrate (in other words, an arrangement is not restricted to an arrangement in which the ink is circulated between the storage chamber and the pressure chamber). The channel substrate is not restricted to include the plurality of members that are adhered mutually, and may include a single member.

The actuator is not restricted to be of a piezo type in which a piezoelectric element as in the abovementioned embodiment has been used, and may be of some other type (such as a thermal type in which a heater element is used, and of an electrostatic type in which an electrostatic force is used).

The liquid discharge head is not restricted to be of a line type, and may be of a serial type (such as a type in which a liquid is jetted on to a recording medium that is conveyed along a conveyance direction, while making the head scan along a direction orthogonal to the conveyance direction). Moreover, the liquid discharge apparatus is not restricted to be equipped with a head unit which includes a plurality of liquid discharge heads, and may include a single liquid discharge head. The liquid to be jetted by the liquid discharge head is not restricted to ink, and it may be an arbitrary liquid (such as a treatment liquid which makes a component in the ink coagulate or precipitate. The recording medium is not restricted to a paper, and may be an arbitrary medium (such as a cloth) on which the recording is possible. The present teaching is not restricted to the printer, and is also applicable to a facsimile, a copy machine, and a multifunction device.

What is claimed is:

1. A liquid discharge head, comprising:
    a channel substrate including a nozzle, a pressure chamber communicating with the nozzle, an actuator covering the pressure chamber, and a contact point electrically connected to the actuator; and
    wherein the channel substrate includes:
        a plate having a surface on which the contact point is located, wherein the surface includes an adhering portion configured to adhere to a circuit board including a wire electrically connected to the contact point, and
        walls defining a hollow space located on a side opposite to the surface of the plate, and
    the adhering portion overlaps with both the hollow space and a portion of the walls in an orthogonal direction orthogonal to the surface of the plate.

2. The liquid discharge head according to claim 1, wherein
    the walls of the channel substrate includes a pair of lateral walls defining a pair of lateral portions of the hollow space, respectively, and
    the adhering portion overlaps with each of the pair of lateral walls in the orthogonal direction.

3. The liquid discharge head according to claim 2, wherein
    a length of the hollow space along a facing direction in which the lateral walls face each other is the shortest in an overlapping portion, of the hollow space, overlapping with the adhering portion in the orthogonal direction.

4. The liquid discharge head according to claim 3, wherein a cross-section, of the hollow space, along a plane including the facing direction and the orthogonal direction has a trapezoidal shape.

5. The liquid discharge head according to claim 3, wherein a cross-section, of the hollow space, along a plane including the facing direction and the orthogonal direction has a convex shape including a small rectangular portion and a large rectangular portion which is larger than the small rectangular portion.

6. The liquid discharge head according to claim 3, wherein a length of the facing portion of the hollow space along the facing direction, and a length of a distant portion, of the hollow space, farthest from the plate along the facing direction are shorter than a length of a portion of the hollow space along the facing direction other than the facing portion and the distant portion.

7. The liquid discharge head according to claim 6, wherein a cross-section of the hollow space along a plane including the facing direction and the orthogonal direction, has a hexagonal shape.

8. The liquid discharge head according to claim 1, wherein
the channel substrate further includes,
a blocking wall overlapping with the plate in the orthogonal direction, sandwiching the hollow space between the plate and the blocking wall in the orthogonal direction, and blocking the hollow space, and
a column being located in the hollow space, connecting the plate and the blocking wall, and being a part of the walls, and
the adhering portion overlaps with the column in the orthogonal direction.

9. The liquid discharge head according to claim 8, wherein
the channel substrate further includes another column, and the column and the another column are mutually separated in an extending direction in which the hollow space is extended, and
the adhering portion overlaps with both the column and the another column.

10. The liquid discharge head according to claim 1, wherein the hollow space forms a channel through which a liquid flows.

11. The liquid discharge head according to claim 10, wherein
the channel substrate includes a return channel configured to return a liquid from each of the plurality of pressure chambers to a storage chamber configured to store the liquid, and
the return channel is the hollow space.

12. The liquid discharge head according to claim 11, wherein
the plurality of pressure chambers is arranged in rows to form a plurality of pressure-chamber rows, and
the hollow space is arranged between two adjacent pressure-chamber rows out of the plurality of pressure-chambers rows, and is shared by the two adjacent pressure-chamber rows.

13. The liquid discharge head according to claim 10, wherein the adhering portion overlaps with the walls in the orthogonal direction so that the adhering portion becomes symmetrical on an upstream and a downstream in a flow direction of a liquid flowing through the hollow space in the adhering portion, with respect to a center of the flow direction.

14. The liquid discharge head according to claim 13, wherein
the channel substrate further includes,
a blocking wall overlapping with the plate in the orthogonal direction, sandwiching the hollow space between the plate and the blocking wall in the orthogonal direction, and blocking the hollow space, and
a column being located in the hollow space, connecting the plate and the blocking wall, and being a part of the walls, and
the adhering portion overlaps with the column in the orthogonal direction so that the adhering portion becomes symmetrical on an upstream and a downstream in the flow direction, with respect to the center of the flow direction.

15. The liquid discharge head according to claim 14, wherein the column has a tapered shape which is tapered toward the upstream in the flow direction.

16. The liquid discharge head according to claim 15, wherein the column has a tapered shape which is tapered toward the downstream in the flow direction.

17. The liquid discharge head according to claim 13, wherein
the channel substrate further includes a narrow portion defined by a pair of lateral walls defining a pair of lateral portions of the hollow space, respectively, a width of the narrow portion along a facing direction in which the lateral walls face each other being smaller than a width of adjacent portions along the facing direction, the adjacent portions being located on the upstream and the downstream of the narrow portion in the flow direction, and
the adhering portion overlaps with the narrow portion in the orthogonal direction, to be symmetrical on the upstream side and the downstream side of the direction of flow, with respect to a center of the direction of flow in the adhering portion.

18. The liquid discharge head according to claim 10, wherein the hollow space has a shape in which a width in the orthogonal direction and a flow direction of a liquid flowing in the hollow space becomes smaller from the upstream to the downstream in the flow direction.

19. The liquid discharge head according to claim 1, wherein the hollow space has a zigzag shape along an extending direction in which the hollow space is extended.

20. The liquid discharge head according to claim 1, wherein the channel substrate further includes:
another nozzle, and
another pressure chamber communicating with the another nozzle, and
the liquid discharge head further includes another actuator the actuator covering the another pressure chamber, and
the contact point of the channel substrate includes a common contact point electrically connected to both the actuator and the another actuator, and a plurality of individual contact points electrically connected to both the actuator and the another actuator, and
the wires include a common wire electrically connected to the common contact point, and a plurality of individual wires electrically connected to the plurality of individual contact points respectively.

21. The liquid discharge head according to claim 20, wherein an area of the adhering portion in which the common contact point and the adhering portion are adhered is larger than an area of the adhering portion in which plurality of individual contact points and the plurality of individual wires respectively, and a dimension of an area overlapping with the walls in the orthogonal direction is large.

22. The liquid discharge head according to claim 1, wherein the walls of the channel substrate includes a pair of lateral walls defining a pair of lateral portions of the hollow space, wherein a thickness "t" of the plate in the orthogonal direction, a length "a" between the pair of lateral portions of the hollow space at which the plate overlaps with the hollow space, and a pressure "x" being exerted to the plate satisfy the following expression $t/a \geq -1.5846x + 22.75$.

\* \* \* \* \*